(12) United States Patent
Yuen et al.

(10) Patent No.: US 6,784,372 B1
(45) Date of Patent: Aug. 31, 2004

(54) ORTHOGONAL ELECTRICAL CONNECTION USING A BALL EDGE ARRAY

(76) Inventors: Albert T. Yuen, 463 Los Pajaros Ct., Los Altos, CA (US) 94024; Pierre H. Mertz, 1700 California St., Apt. #2, Mountain View, CA (US) 94041

( * ) Notice: Subject to any disclaimer, the term of this patent is extended or adjusted under 35 U.S.C. 154(b) by 0 days.

(21) Appl. No.: 09/579,649

(22) Filed: May 26, 2000

(51) Int. Cl.$^7$ ................................................ H05K 1/00
(52) U.S. Cl. ...................................... 174/250; 174/260
(58) Field of Search ................................ 174/260–264; 361/760–767, 776–780, 803; 438/109–110, 612–614; 257/666, 696, 777–780

(56) References Cited

U.S. PATENT DOCUMENTS

| | | | | |
|---|---|---|---|---|
| 5,397,747 A | * | 3/1995 | Angiulli et al. | ............. 438/109 |
| 5,451,815 A | * | 9/1995 | Taniguchi et al. | ........... 257/696 |
| 5,574,310 A | * | 11/1996 | Sono et al. | ................... 257/696 |
| 5,742,844 A | * | 4/1998 | Feldman | ...................... 712/32 |
| 5,991,781 A | * | 11/1999 | Nielsen | ........................ 715/513 |
| 6,147,411 A | * | 11/2000 | Kinsman | ..................... 257/777 |
| 6,239,012 B1 | * | 5/2001 | Kinsman | ..................... 438/612 |

* cited by examiner

*Primary Examiner*—David Nelms
*Assistant Examiner*—Tuan Dinh
(74) *Attorney, Agent, or Firm*—Townsend and Townsend and Crew LLP

(57) ABSTRACT

An orthogonal electrical connector using a ball edge array includes one or more stackable fiber optic transceivers, wherein each transceiver includes an electrical substrate, and arrays of solder, which is in form of solder balls or solder paste. The solder is held in predetermined position adjacent to the electrical traces on both sides of the electrical substrate inserted into voids on the molded housing and aligned to contact the electrical traces on the motherboard. The electrical traces on the electrical substrate and the motherboard are located close enough so that the solder physically touches both parts during the soldering process. The solder is reflowed by heat, and the melted solder "wicks up" the electrical traces on the electrical substrate by surface tension.

13 Claims, 5 Drawing Sheets

ORTHOGONAL ELECTRICAL CONNECTION USING A BALL EDGE ARRAY

FIELD OF THE INVENTION

This invention relates generally to packaging of edge electrical connectors. More particularly, it relates to high density packaging of an orthogonal electrical connection using a ball edge array.

BACKGROUND ART

Electrical packages are constantly increasing in functionality while shrinking in size. In an attempt to assemble more functionality into smaller packages certain limitations become evident. One of these limitations is the number of connections to external circuit elements, commonly referred to as "input-output" or "I/O" connections, that can be placed at the edge of any given printed circuit board card. The factors limiting the number of I/O connections per card are usually the linewidth of electrical traces on the card or the availability of small edge connectors.

In the prior art, the electrical connections were made using mechanical, e.g. spring loaded, electrical connectors. Such mechanical connectors add to the inductance and capacitance of the electrical trace, which reduces the speed of data that can be carried by the connector. Furthermore, mechanical connectors take up a relatively large amount space, which reduces the maximum number of connectors per unit length.

FIG. 1 is an isometric schematic diagram of an edge pin connector 100 of the prior art. The limitation of this connector is that the size of a pin 104 is relatively large compared to a card 102, therefore few pins may be fit on an edge 106 of the card 102. In addition, the pin 104 attaches on both sides of the card 100 as shown in FIG. 1. This feature eliminates the possibility of having independent I/O connections on both sides of an electrical substrate.

FIG. 2 is another isometric schematic diagram of an edge connector 200, based on edge castellation of the prior art showing a method using a cut-off via 204 to form an edge connection. The number of I/O connections that can fit on an edge of a card 202 is limited by the size of the vias 204 that can be fabricated. Since via 204 is much larger than an electrical trace (not shown in FIG. 2) on the card 202, fewer I/O connections are possible using this technique. In addition, the pitch of the vias is limited by the soldering technique that is used to surface mount the card onto a user's board. If the pitch is too high, the solder paste may cause an electrical bridge or short between two adjacent vias 204. Furthermore, the use of edge castellation requires the via to contact both sides of the board for an I/O connection, which eliminates the possibility of having independent I/O connections on both sides of an electrical substrate.

U.S. Pat. No. 5,793,116, issued Aug. 11, 1998 to Rinne et al. discloses a method of microelectronic packaging using arched solder columns. In this application, the microelectronic packages are formed wherein solder bumps on one vertical substrate are expanded, to thereby extend and contact the horizontal substrate, which is aligned perpendicularly with the vertical substrate, and form a solder connection. The solder bumps are formed by reflowing the solder. The solder is reflowed from an elongated, narrow solder-containing region adjacent the solder bumps, into the solder bump. The melted solder bumps on a vertical substrate reflow down by gravity and contact the pads on the horizontal substrate. After reflow, the solder bump extends across a pair of adjacent substrates and form an arched solder column or partial ring of solder between the two substrates. However, this technique requires a relatively large amount of solder, and the size of the arched solder column is relatively large compared to the substrate, therefore fewer I/O connections are possible using this technique. In addition, there is a cross connection between the adjacent arched solder columns during the reflowing process.

There is a need, therefore, for an improved method of making an electrical edge connector, which overcomes the above difficulties.

OBJECTS AND ADVANTAGES

Accordingly, it is a primary object of the present invention to provide an orthogonal electrical connector with the I/O connections on both sides of an electrical substrate without the cross connection between adjacent I/O connections.

It is a further object of the present invention to provide an orthogonal electrical connector with high density packaging of I/O connections.

It is an additional object of the present invention to provide an orthogonal electrical connector capable carrying data at a high speed.

SUMMARY

These objects and advantages are attained by a solderable orthogonal electrical connection.

In accordance with a first embodiment of the present invention, an apparatus contains one or more stackable fiber optic transceivers, wherein each transceiver includes an electrical substrate having electrical traces terminating on its edges. Electrical traces that are configured to receive solder are disposed on both sides of the electrical substrate. The apparatus may optionally include molded housings for retaining solder in predetermined position adjacent the electrical traces on the substrates. The molded housings are patterned with voids or pockets. Alternatively the solder may be held in place on electrical traces on a matching motherboard.

The electrical substrate is typically made of ceramic or plastic. The molded housings are made of ceramic, plastic, or metal. The electrical substrate has alignment features such as holes, bump, or shapes. The molded housings may have alignment features conforming to alignment features on the electrical substrate. The solder may be in the form of solder paste or solder balls having a diameter of about 350 microns. The solder may be made of Pb—Sn, In—Sn, Cu—Ni, or Ag. The density of soldered electrical traces on edges of the electrical substrate is typically about 40 solder traces/inch/side or greater. Apparatuses of this type have each electrical trace capable of carrying data at a speed greater than 100 MHz.

The solder is inserted into voids on molded housings, which are aligned with both sides of an edge of the electrical substrate to hold the solder in predetermined position so that the solder can contact electrical traces. The solder is reflowed to electrically and mechanically attach to electrical traces.

According to a second embodiment of the present invention, an apparatus includes one or more fiber optic transceivers, wherein each transceiver includes one vertical electrical substrate having electrical traces terminating at its edge, and a motherboard perpendicularly aligning to the edges of the electrical substrates. The motherboard has electrical traces made corresponding to electrical traces on the electrical substrate. Electrical traces are disposed on both sides of the electrical substrate. Electrical traces on the motherboard and the electrical substrate are located close enough so that the solder physically touches both parts upon melting. The solder is typically in the form of solder paste or solder balls having a diameter of about 350 microns. The electrical substrate and solder are made of materials similar to those of the electrical substrate and solder in the first embodiment of the present invention. The motherboard is typically made of ceramic, plastic, or metal. The density of soldered electrical traces on edges of the electrical substrate and the speed of carrying data of this connector are similar to those of the density and the speed in the first embodiment.

According to a third embodiment, the substrate and motherboard may be connected according to a method that uses relatively small amounts of solder. In the method, the motherboard is perpendicularly aligned to the edges of vertical electrical substrates. Arrays of solder are deposited on the electrical traces on the motherboard. The solder is melted, reflowed and "wicks up" the electrical traces on the electrical substrate by the surface tension. Molded housings of the type depicted in the first embodiment may optionally be used to hole the solder in predetermined position before the solder is reflowed. Thus, when the solder solidifies, it electrically and mechanically bonds to electrical traces.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

Figure 1:
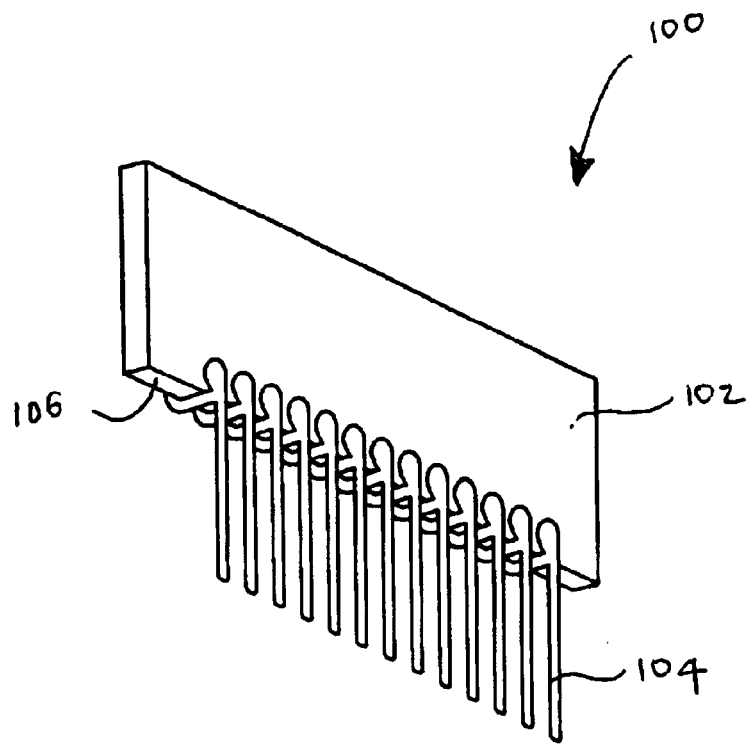
FIG. 1 is an isometric schematic diagram of an edge pin connector of the prior art.
Figure 2:
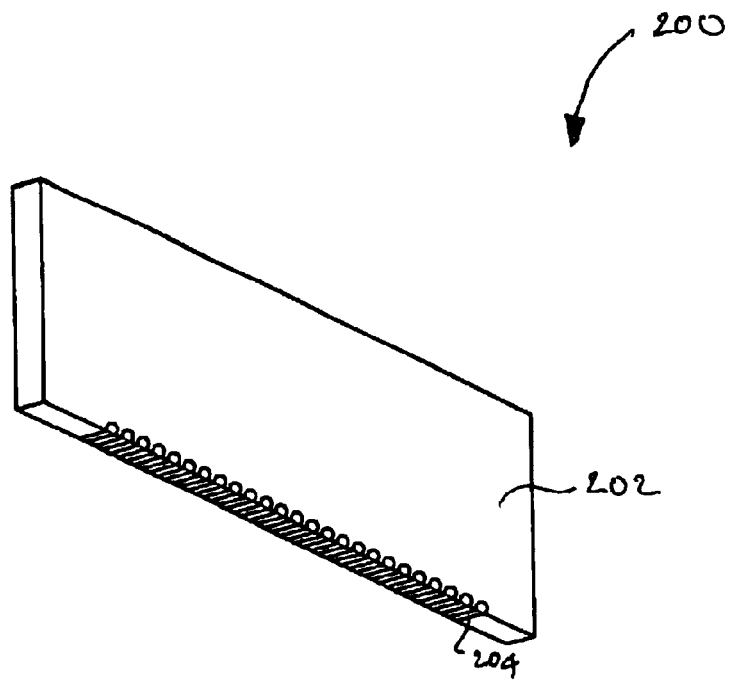
FIG. 2 is an isometric schematic diagram of an edge castellation connector of the prior art.
Figure 3A:
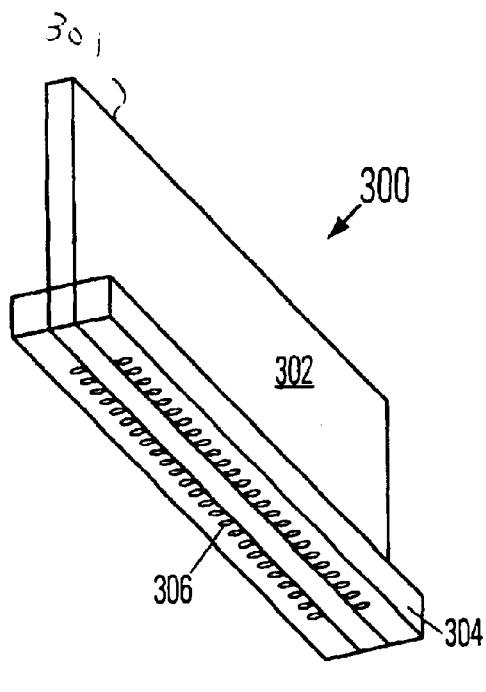
FIG. 3A is an isometric bottom view of a solder ball edge connector within molded housings according to a first embodiment of the present invention.

FIG. 3A shows an isometric bottom view of a fiber optic transceiver apparatus 300 according to a first embodiment of the present invention. The apparatus 300 includes one or more stackable fiber optic transceivers 301, only one of which is shown for the sake of simplicity. Each transceiver 301 includes an electrical substrate 302 and electrical components disposed on the electrical substrate 302, which are not shown in FIG. 3A. The electrical substrate 302 has multiple electrical traces 310 on both sides of its edges (shown in FIGS. 3B–C). The electrical substrate 302, which is a microelectronic board such as printed circuit board, is made of ceramic or plastic and has alignment features such as holes, bumps, or shapes.

The apparatus may optionally include two arrays of solder balls 306, and two molded housings 304 holding the solder balls 306 in predetermined position adjacent one or more of the electrical traces 310. The molded housings 304 are patterned with voids or pockets, which match with patterns of electrical traces 310 on edges of the electrical substrate 302. The molded housings 304 are made of ceramic, plastic, or metal, and have alignment features that conform with the alignment features on the electrical substrate 302. Such alignment features may comprise pins, holes, slots, grooves and the like, which are made with corresponding features on the electrical substrate 302, a motherboard and another electrical substrate. The solder balls 306 have diameter of about 350 microns and are made of Pb—Sn, In—Sn, Cu—Ni, or Ag. The solder balls 306 may be replaced by solder paste.

As shown in FIG. 3A, each substrate 302 contains I/O connections e.g. electrical traces 310 on both sides. The density of soldered electrical traces, or the density of I/0 connections, on edges of the electrical substrate 302 is about 40 soldered traces/inch/side or greater. The molded housing 304 prevents a cross connection between adjacent soldered electrical traces during the reflowing process. The substrate 302 and/or molded housings 304 may include alignment features, such as pins that fit into holes in a motherboard to facilitate alignment.

Figure 3B:
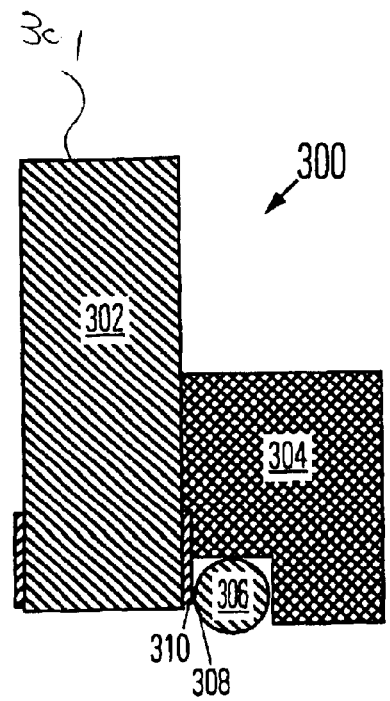
FIG. 3B is a cross-sectional view depicting one side of the solder ball edge connector illustrated in FIG. 3A.
Figure 3C:
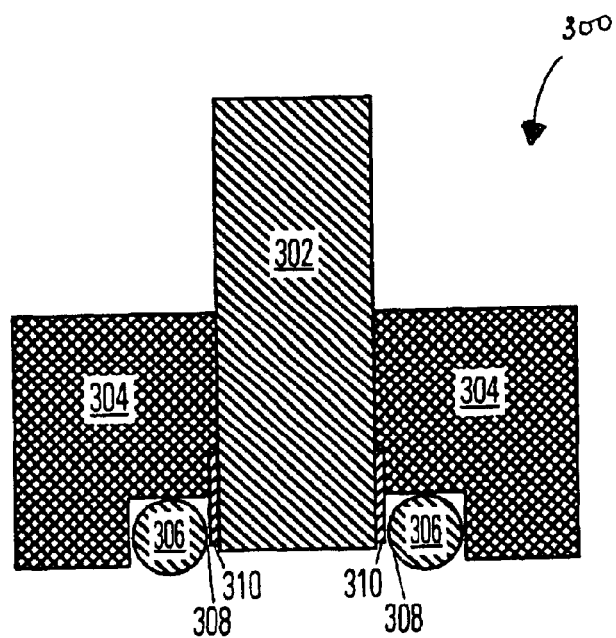
FIG. 3C is a cross-sectional view of the solder ball edge connector illustrated in FIG. 3A.

A cross-sectional view depicting one side of the apparatus 300 is shown in FIG. 3B. The solder balls 306 are inserted into voids 308 of the molded housing 304. The molded housing 304 is aligned with one edge of the electrical substrate 302 so that the solder balls 306 are hold in predetermined position and can contact electrical traces 310. The solder balls 306 are reflowed to bond to electrical traces 310. FIG. 3C shows a cross-sectional view of the connector 300 with two solder ball arrays 306 bonding to both sides of the electrical substrate 302. This method of packaging can produce connectors with each electrical trace capably handling data at a speed greater than 100 MHz.

Figure 4:
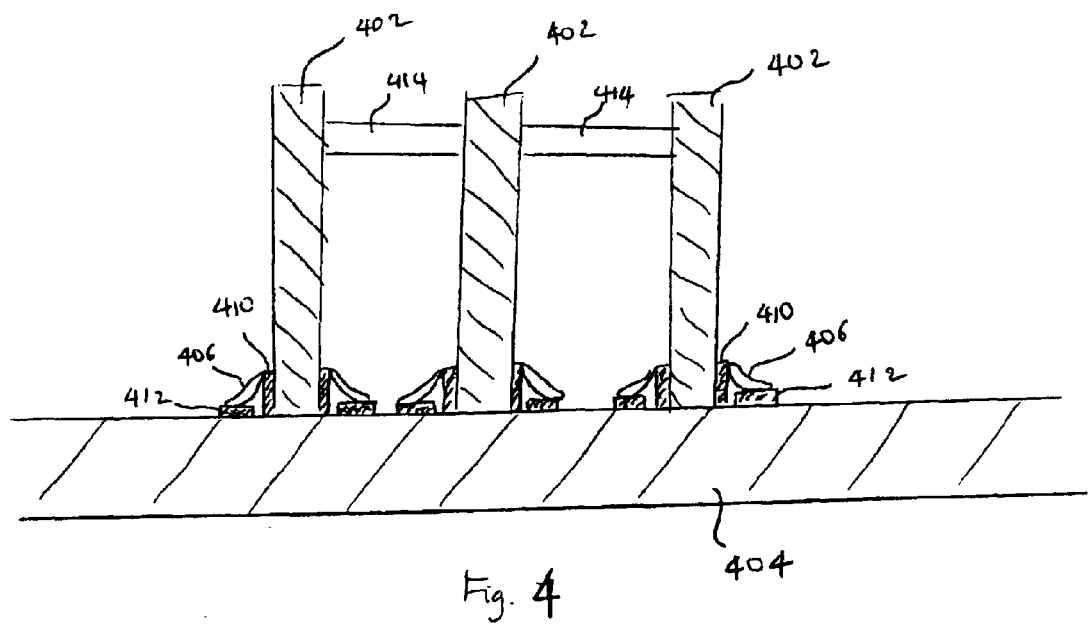
FIG. 4 is a cross-sectional view of a soldered edge connector with stackable electrical substrates according to a second embodiment of the present invention.

FIG. 4 is a cross-sectional view of an apparatus 400 according to a second embodiment of the present invention. The apparatus 400 includes stackable fiber optic transceivers, each of which includes one vertical electrical substrate 402, and a motherboard 404 perpendicularly aligning to the edges of the electrical substrates 402. The electrical substrates 402 are stacked using a method disclosed in the U.S. patent application Ser. No. 09/459,422 filed in Dec. 9, 1999, entitled "Method and Apparatus for Combined Alignment and Heat Drain of Stacked Processing Stages" by Albert Yuen et al. As shown in FIG. 4, the electrical substrates 402 are stacked by heat drain profiles 414. The heat drain profiles 414 establish mechanical and thermal connections between the electrical substrates 402. The heat drain profiles 414 drain the heat created during the functional operation of the electrical substrates 402 into a heat sink base which is not shown in FIG. 4.

Substrate 402 has electrical traces 410 terminating at its edges on both sides. The motherboard 404 has electrical traces 412 that are made corresponding to the electrical traces 410 on the electrical substrates 402. The material of electrical substrate 402 is similar to material of the electrical substrate 302 in FIG. 3A. The motherboard 404 may be made of ceramic, plastic, or metal. The solder connections 406 connect the electrical traces 410 on the electrical substrate 402 to the electrical traces 412 on the motherboard 404. The solder 406 is typically made of material similar to the material of solder 306 of apparatus 300 in FIG. 3A.

Figure 5A:
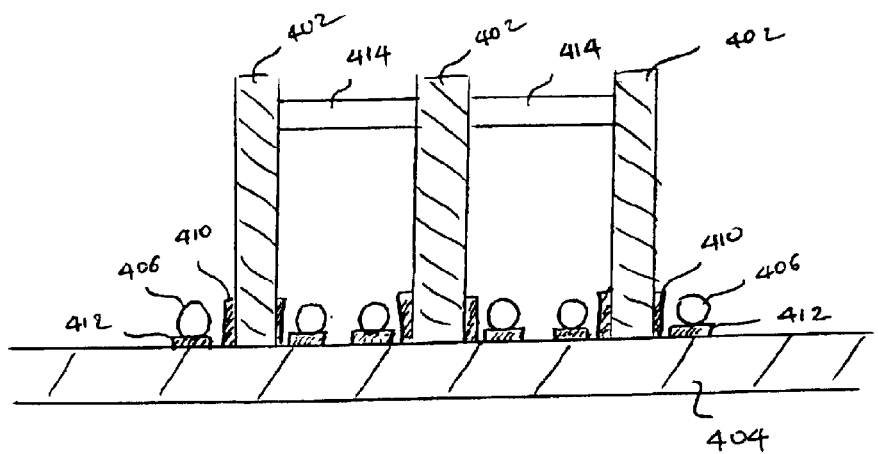
FIGS. 5A–C are cross-sectional schematic diagrams illustrating the steps of a process of making the orthogonal edge connector depicted in FIG. 4 using solder balls according to a third embodiment of the present invention.
Figure 5B:
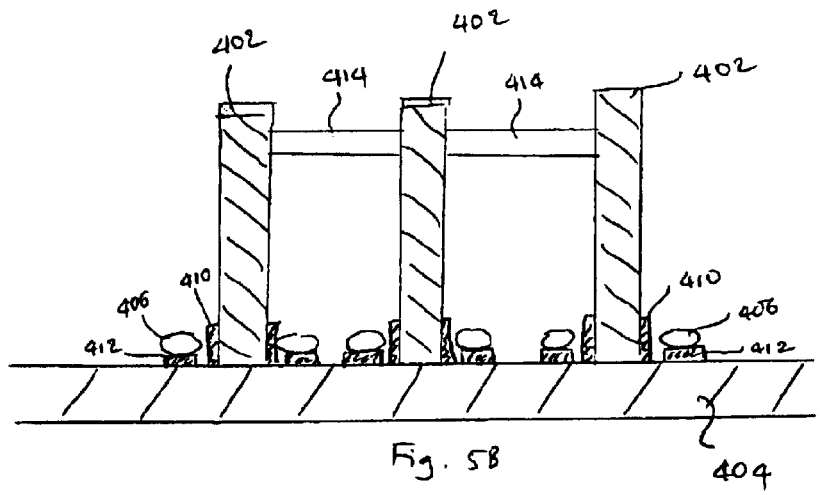
Figure 5C:
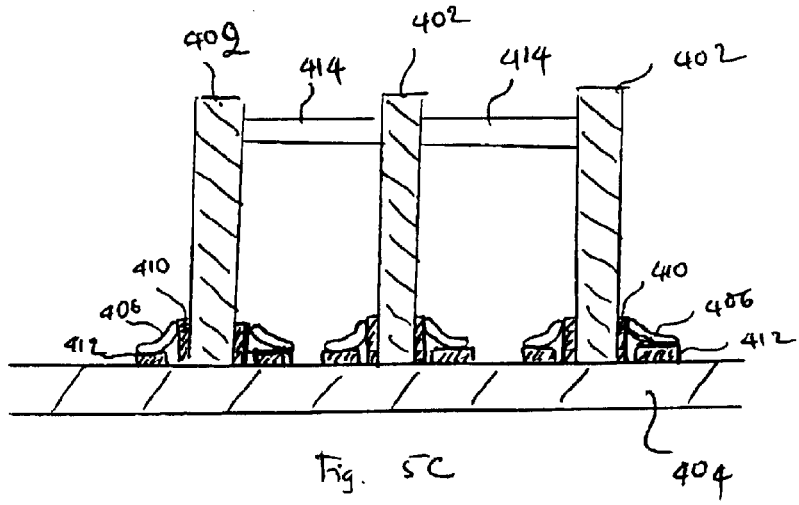

The process of soldering the vertical electrical substrate 402 to the motherboard 404 using solder balls 406 is described in FIG. 5A–C according to a third embodiment of the present invention. As shown in FIG. 5A the solder balls 406 is deposited on the electrical traces 412 on the motherboard 404. Then the solder balls 406 are melted and reflowed by heat of an oven, a hot plate or a hot air jet. Because the solder tends to preferentially wet metal, the melted solder "wicks up" the vertical electrical traces 410 on the electrical substrate 402 by surface tension as shown in FIG. 5B. The electrical traces 410 on the electrical substrate 402 and the electrical traces 412 on the motherboard 404 are located close enough so that the melted solder physically touches both electrical traces 410 and 412. In an exemplary embodiment, electrical traces 410 and 412 are separated by a gap of about 5 microns. The gap generally varies with the type and amount of solder used. FIG. 5C shows a completed orthogonal electrical connector 400 with the solder 406 electrically and mechanically bonding to the electrical traces 410 and 412.

Figure 6A:
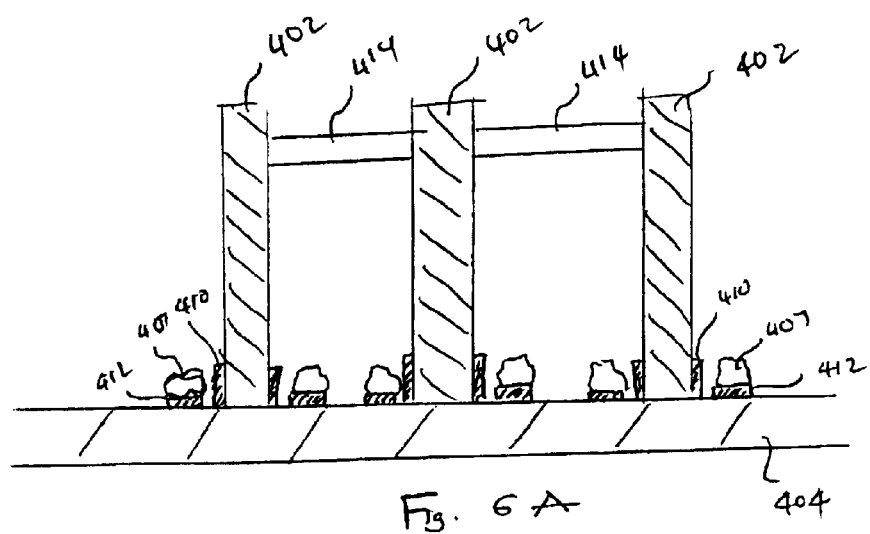
FIGS. 6A–C are cross-sectional schematic diagrams illustrating the steps of a process of making the orthogonal edge connector depicted in FIG. 4 using solder paste.
Figure 6B:
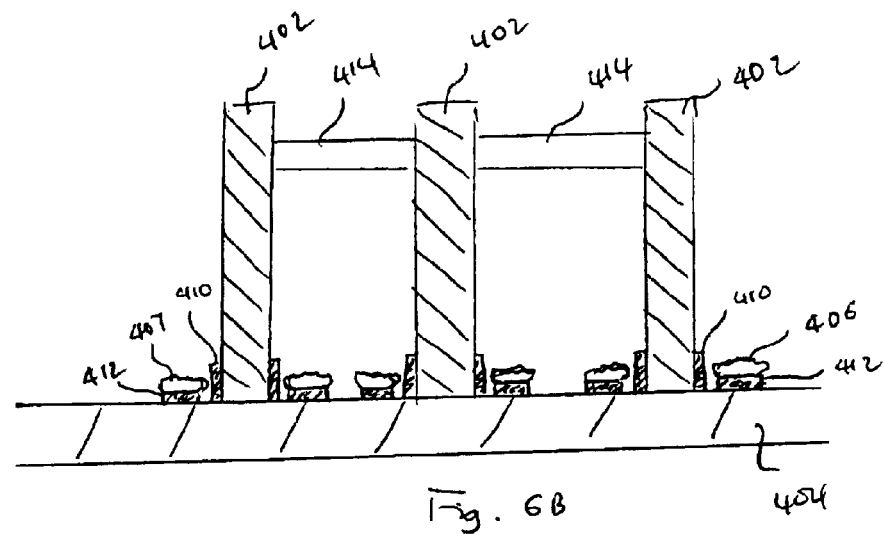
Figure 6C:
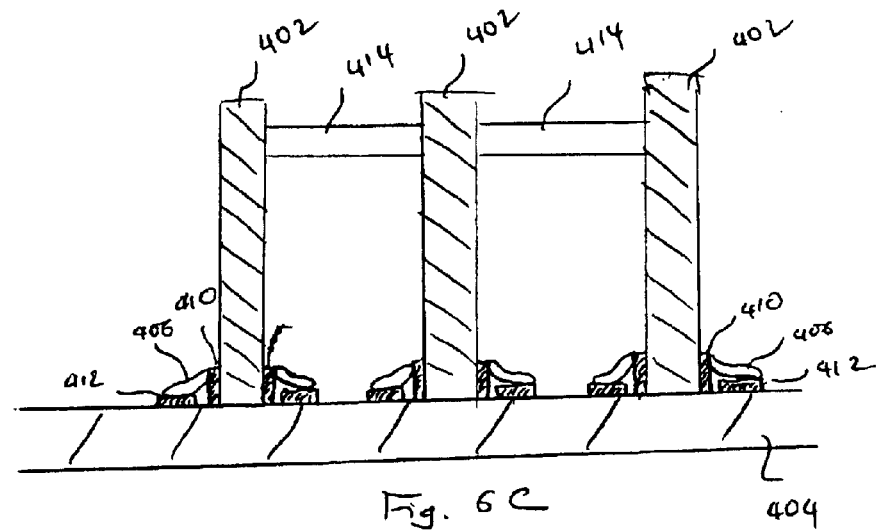

FIGS. 6A–C show a process of soldering the electrical substrate 402 to the motherboard 404 using solder paste 407 deposited on the electrical traces 412. The steps of this process is similar to the process described in FIGS. 5A–C.

The density of soldered electrical traces on edges of the electrical substrate and the speed of carrying data of the orthogonal electrical connector 400 are similar to those of the density and the speed of the apparatus 300 as described in FIG. 3C.

Two molded housings of the type depicted in FIGS. 3A–B may optionally be used to hold solder 406 in predetermined positions adjacent electrical traces 412 on the motherboard 404 before reflowing the solder 406.

It will be clear to one skilled in the art that the above embodiment may be altered in many ways without departing from the scope of the invention. For example, the molded housings 304 may be parts of the electrical substrate, parts of the motherboard or a separate piece entirely. Accordingly, the scope of the invention should be determined by the following claims and their legal equivalents.

What is claimed is:

1. An apparatus comprising:
one or more stackable fiber optic transceivers, wherein each transceiver includes an electrical substrate having two sides with one or more electrical traces on each side terminated at an edge of the substrate; and wherein the electrical traces on the substrate align with one or more traces at predetermined positions on a motherboard, wherein the predetermined position of each trace on the motherboard is sufficiently close to a corresponding trace on the electrical substrate so that melted solder on one or more of the motherboard traces can wick up onto the substrate traces to form an electrical connection; and
one or more molded housing for retaining solder adjacent the traces on the electrical substrate; wherein the one or more molded housing are patterned with voids or pockets.

2. The apparatus of claim 1, wherein each electrical trace can carry data at a speed greater than 100 MHz.

3. The apparatus of claim 1, wherein each electrical substrate is made of a material selected from the group consisting of ceramic and plastic.

4. The apparatus of claim 1, wherein the solder comprises a material selected from the group consisting of Pb—Sn, I—Sn, Cu—Ni, and Ag.

5. The apparatus of claim 1, wherein the solder is in the form of a solder paste.

6. The apparatus of claim 1, wherein the solder is in the form of one or more solder balls.

7. The apparatus of claim 1, wherein the molded housings hold solder on both sides of the electrical substrate.

8. The apparatus of claim 1, wherein the molded housing prevents cross connection between the electrical traces.

9. The apparatus of claim 1, wherein the molded housing has alignment features that conform to alignment features on the electrical substrate.

10. The apparatus of claim 1, wherein the molded housing comprises a material selected from the group consisting of ceramic, plastic, and metal.

11. The apparatus of claim 1, wherein the solder protrudes outside of the one or more molded housing.

12. The apparatus of claim 1, wherein one or more of the electrical substrates have alignment features that conform to alignment features on the motherboard.

13. The apparatus of claim 6, wherein the solder balls have a diameter of about 350 microns.

* * * * *